(12) United States Patent
Kim et al.

(10) Patent No.: US 7,583,076 B2
(45) Date of Patent: Sep. 1, 2009

(54) TEST TRAY AND HANDLER USING THE TEST TRAY

(75) Inventors: Yong Sun Kim, Suwon-si (KR); Hyo Chul Yun, Namyangju-si (KR); Dae Gon Yun, Gumi-si (KR)

(73) Assignee: Mirae Corporation, Chungcheongnam-Do (KR)

( * ) Notice: Subject to any disclaimer, the term of this patent is extended or adjusted under 35 U.S.C. 154(b) by 0 days.

(21) Appl. No.: 12/017,730

(22) Filed: Jan. 22, 2008

(65) Prior Publication Data

US 2008/0174299 A1 Jul. 24, 2008

(30) Foreign Application Priority Data

Jan. 23, 2007  (KR) .................... 10-2007-0007178

(51) Int. Cl.
*G01R 31/26* (2006.01)

(52) U.S. Cl. .................................. 324/158.1; 324/765

(58) Field of Classification Search ...................... None
See application file for complete search history.

(56) References Cited

U.S. PATENT DOCUMENTS

| 6,339,321 B1 * | 1/2002 | Yamashita et al. ....... 324/158.1 |
| 6,414,510 B1 * | 7/2002 | Takeuchi et al. ............ 324/765 |
| 6,459,259 B1 * | 10/2002 | Ito et al. .................. 324/158.1 |

* cited by examiner

*Primary Examiner*—Minh N Tang
(74) *Attorney, Agent, or Firm*—Ked & Associates LLP (57) ABSTRACT

A semiconductor chip test handler includes a first chamber in which packaged chips contained in a test tray are heated to high temperature or cooled to low temperature, a second chamber in which the packaged chips contained in the test tray are tested, and a third chamber in which the packaged chips contained in the test tray are cooled or heated to room temperature. The test trays are horizontally and/or vertically moved in an upright position between the first, second, and third chambers. The chambers may be arranged in a row or in a column. The test trays include a frame and a plurality of carriers into which the packaged chips are loaded. Connecting member and or projections are detachably mounted on lateral sides of the frame. A moving apparatus for moving the test trays between the first, second, and third chambers uses the connecting members and projections to push or pull the test trays into and out of the chambers.

22 Claims, 12 Drawing Sheets

TEST TRAY AND HANDLER USING THE TEST TRAY

BACKGROUND

1. Field

The present application discloses a test handler and a test tray for holding packaged semiconductor chips while they are tested in a test handler.

2. Background

A handler puts packaged chips through one or more electrical tests after they have been manufactured. The handler transfers the packaged chips from a user tray to a test tray and supplies the test tray to a tester. The tester includes a test board with a plurality of sockets. The handler makes the packaged chips in the test tray contact with sockets of the test board. The tester then performs the electrical tests on the packaged chips. After grading the packaged chips according to test results, the handler transfers them from the test tray to corresponding user trays.

The handler includes first, second, and third chambers. In the first chamber, the packaged chips in the test tray are heated to an extremely high temperature or cooled to an extremely low temperature. In the second chamber, the packaged chips in the test tray receive the electrical tests. In the third chamber, the packaged chips in the test tray are cooled or heated back to room temperature. The packaged chips in the test tray go through the first, second, and third chambers in this order.

There are multiple different kinds of test handlers which have slightly differing configurations. In some handlers, the first, second and third chamber are arranged horizontally. In others, the first, second and third chambers are arranged vertically. In some handlers, only a single test tray of chips is tested at one time in the second chamber. In other handlers, multiple test trays of chips are tested in the second chamber simultaneously. Examples of such test handlers are described in U.S. patent application Ser. No. 11/753,553, which was filed on Jan. 9, 2004 and in Ser. No. 11/713,683, filed on Mar. 5, 2007, the contents of both of which are hereby incorporated by reference.

These handlers require a moving apparatus for moving the test trays through the first, second, and third chambers, in this order. And the test trays require various features which the moving apparatus can grasp or push or pull to move the trays through the various chambers.

Unfortunately, the moving apparatus in the various kinds of handler are not compatible with each other. In other words, the features on the test trays which the moving apparatus use to move the trays is different for the different handlers. As a result, a test tray having a single configuration cannot be used interchangeably between the different types of handlers. Instead, multiple different types of test trays must be used.

BRIEF DESCRIPTION OF THE DRAWINGS

The embodiments will be described in detail with reference to the following drawings, in which like reference numerals refer to like elements, and wherein.

DETAILED DESCRIPTION

Multiple different types of handlers will now be described with reference to FIGS. 1-3. The reference characters in FIGS. 1-3 indicate components which are provided in a path that a test tray follows in the handlers.

Figure 1:
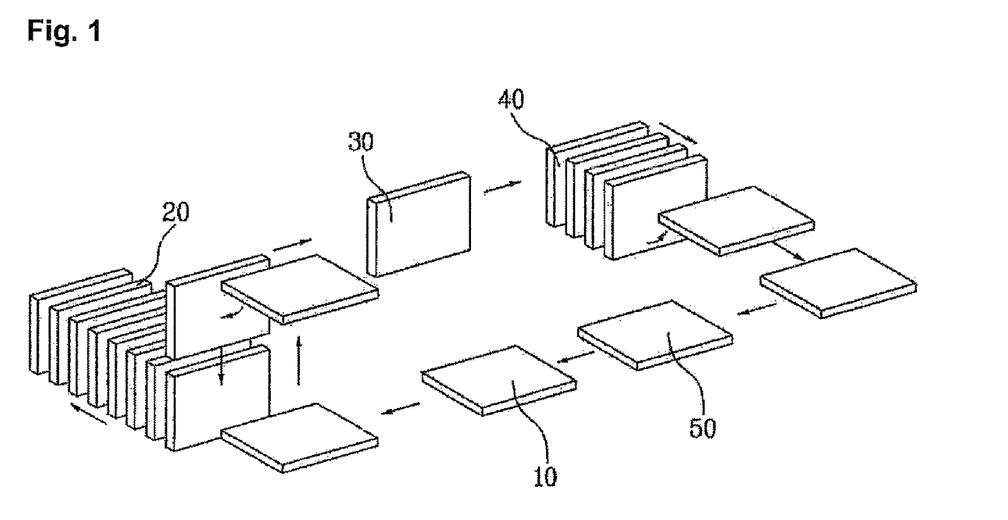
FIG. 1 is a schematic view of the path that a test tray follows in a first embodiment of a handler.

FIG. 1 is a schematic view of the path that a test tray follows a first embodiment of a handler. As shown in FIG. 1, the first handler includes a loading unit 10, a first chamber 20, a second chamber 30, a third chamber 40, and an unloading unit 50. The first, second and third chambers 20, 30, and 40 are horizontally located in a row relative to each other. Thus, the test tray is moved through the first, second and third chambers 20, 30, and 40, in this order.

Packaged chips are first loaded onto a test tray which is oriented horizontally at the loading unit 10. The test tray containing the packaged chips is then moved to the first chamber 20. The test tray is rotated by 90 degrees to be in the upright position, and the upright-positioned test tray is introduced into the first chamber 20. Each test tray then progresses from the front to the rear of the first chamber 20 in a series of steps. While passing from the front to the back of the first chamber 20, the packaged chips in the upright-positioned test trays are heated to an extremely-high temperature or cooled to an extremely-low temperature.

Subsequently, the upright-positioned test tray is introduced into the second chamber 30, where electrical tests are performed on the packaged chips.

Thereafter, the upright-positioned test tray is introduced into the third chamber 40. The trays move from the rear to the front of the third chamber 40 in a series of steps. During their passage through the third chamber 40, the packaged chips in the upright-positioned test trays are cooled or heated back to room temperature.

Subsequently, the upright-positioned test tray is rotated by 90 degrees to resume a horizontal orientation. The horizontally-positioned test tray is moved to the unloading unit 50. The packaged chips are unloaded from the horizontally-positioned test tray in the unloading unit 50.

Figure 2:
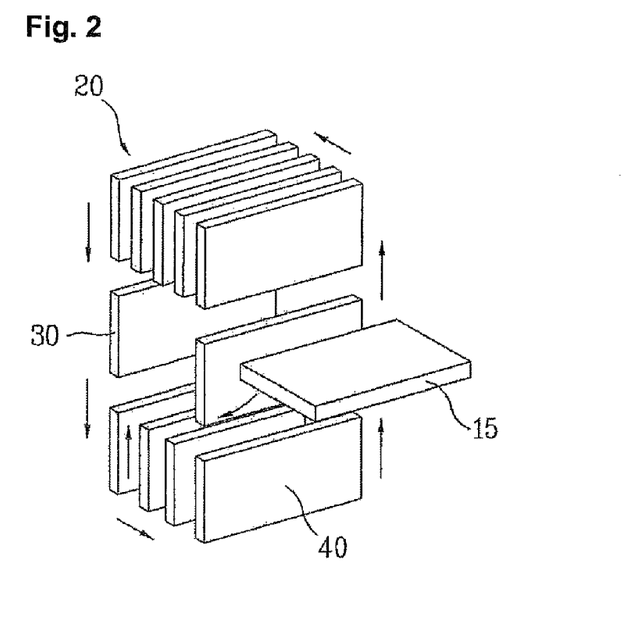
FIG. 2 is a schematic view of a path that a test tray follows in a second embodiment of a handler.

FIG. 2 is a schematic view of a path that test trays follow in a second embodiment of a handler. As shown in FIG. 2, the second handler includes a loading/unloading unit 15, a first chamber 20, a second chamber 30, and a third chamber 40. The first and second chambers 20 and 40 are vertically located in a column relative to each other, with the second chamber 30 in between. Thus, the test tray is vertically moved through the first, second and third chambers 20, 30, and 40, in this order.

The packaged chips are first loaded onto a horizontally oriented test tray in the loading/unloading unit 15. The test tray is then rotated by 90 degrees to be in the upright position. Subsequently, the upright-positioned test tray is introduced into the first chamber 20. The trays in the first chamber progress from the front to the rear while the packaged chips in the upright-positioned test trays are heated to an extremely-high temperature or cooled to an extremely-low temperature during their passage through the first chamber 20.

Subsequently, the upright-positioned test tray is introduced into the second chamber 30, and electrical tests are performed on the packaged chips.

Thereafter, the upright-positioned test tray is introduced into the third chamber 40. The packaged chips in the upright-positioned test trays are cooled or heated back to room temperature during their passage through the third chamber 40.

Subsequently, the upright-positioned test tray is rotated by 90 degrees to resume the horizontal orientation, and the horizontally-positioned test tray is moved to the loading/unloading unit 15. The packaged chips are unloaded from the horizontally-positioned test tray in the loading/unloading unit 15.

In both the first and second handlers upright-positioned test trays are introduced into the first chamber 20 and the trays progress through the first chamber while the chips are heated or cooled. Then, the upright-positioned test tray is introduced into the second chamber 30 for testing. Thereafter, the upright-positioned test trays are introduced into the third chamber 40, and the trays progress through the third chamber 40 while the chips are returned to room temperature.

Figure 3:
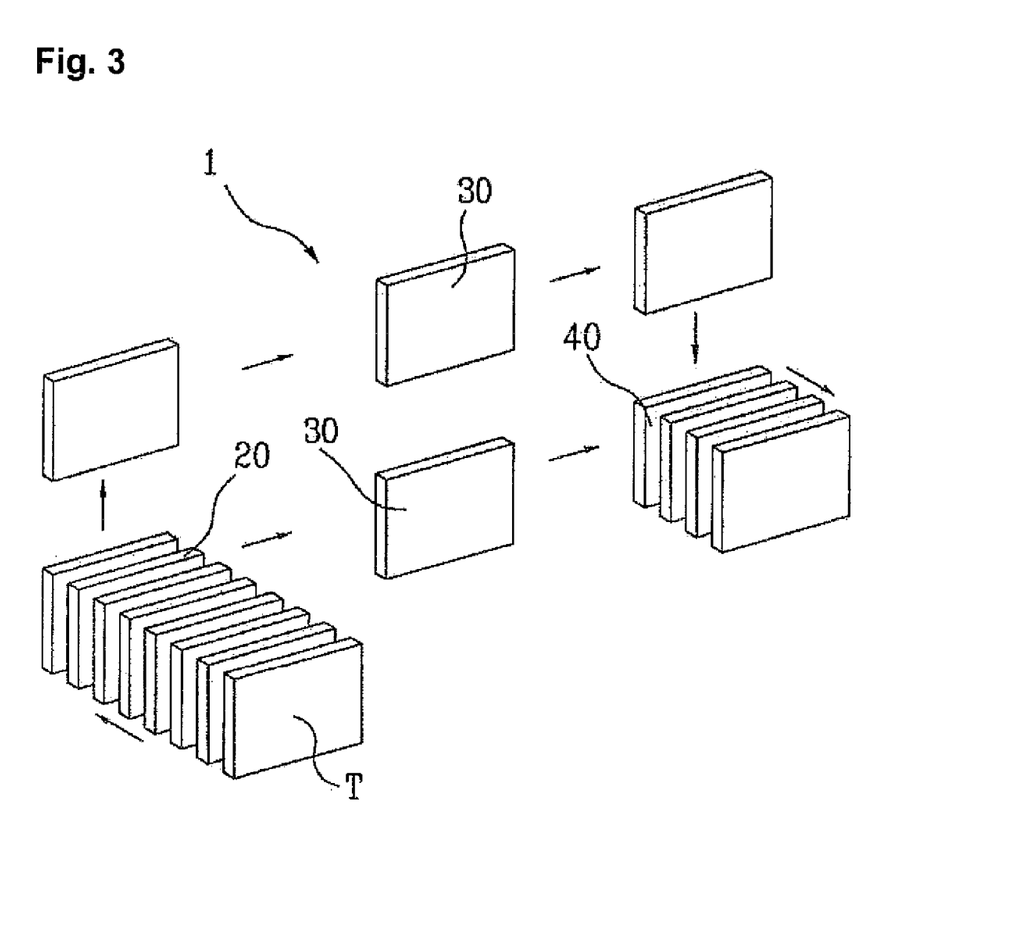
FIG. 3 is a schematic view of a path that a test tray follows in a third embodiment of a handler.

In the third embodiment of a handler, as shown in FIG. 3, packaged chips intended for an electrical test are loaded onto test trays while they are in horizontal orientation at a loading unit (not shown). After the packaged chips are loaded, the test tray T is rotated by 90 degrees to be in the upright position, and is moved into the first chamber 20.

The upright-positioned test trays T are moved from the front to the rear of the first chamber 20. During the passage, the packaged chips are heated to an extremely-high temperature or cooled to an extremely-low temperature.

Thereafter, the upright-positioned test trays T are moved into the second chamber 30 and the packaged chips are tested inside the second chamber 30. Note, in this embodiment, multiple test trays may be in the second chamber at the same time.

Thereafter, the upright-positioned test trays T are moved into the third chamber 40 and the packaged chips are cooled or heated to room temperature during the passage through the third chamber 40. After the packaged chips are cooled or heated to room temperature, the test tray is rotated by 90 degrees back to the horizontal orientation. The horizontally positioned test tray is then moved to an unloading unit (not shown). In the unloading unit, the packaged chips are loaded onto corresponding user trays.

As illustrated in FIGS. 1-3, in some handlers the test trays must be moved horizontally as they move from the first chamber to the second chamber, and then on to the third chamber. In other types of handlers, the test trays must be moved vertically from the first chamber to the second chamber, and then on to the third chamber.

If a single type of test tray T is to be used in all types of handlers, it must be equipped with connecting members that are compatible with all of the different types of moving apparatus in the different handlers which move test trays horizontally and vertically. This would make it possible for the test tray T to be used interchangeably in all of the different types of handlers.

There are four basic paths that the test trays T must follow. The first path is one that the test tray T follows to be moved inside the first chamber. The second path is one that the test tray T follows to be moved from the first chamber 20 to the second chamber 30. The third path is one that the test tray T follows to be moved from the second chamber 30 to the third chamber 40. The fourth path is one that the test tray T follows to be moved forward inside the third chamber 40. Thus, the test tray T is required to be equipped with connecting members that are compatible with the different types of moving apparatus that move the test tray T horizontally or vertically along the four paths.

Figure 4:
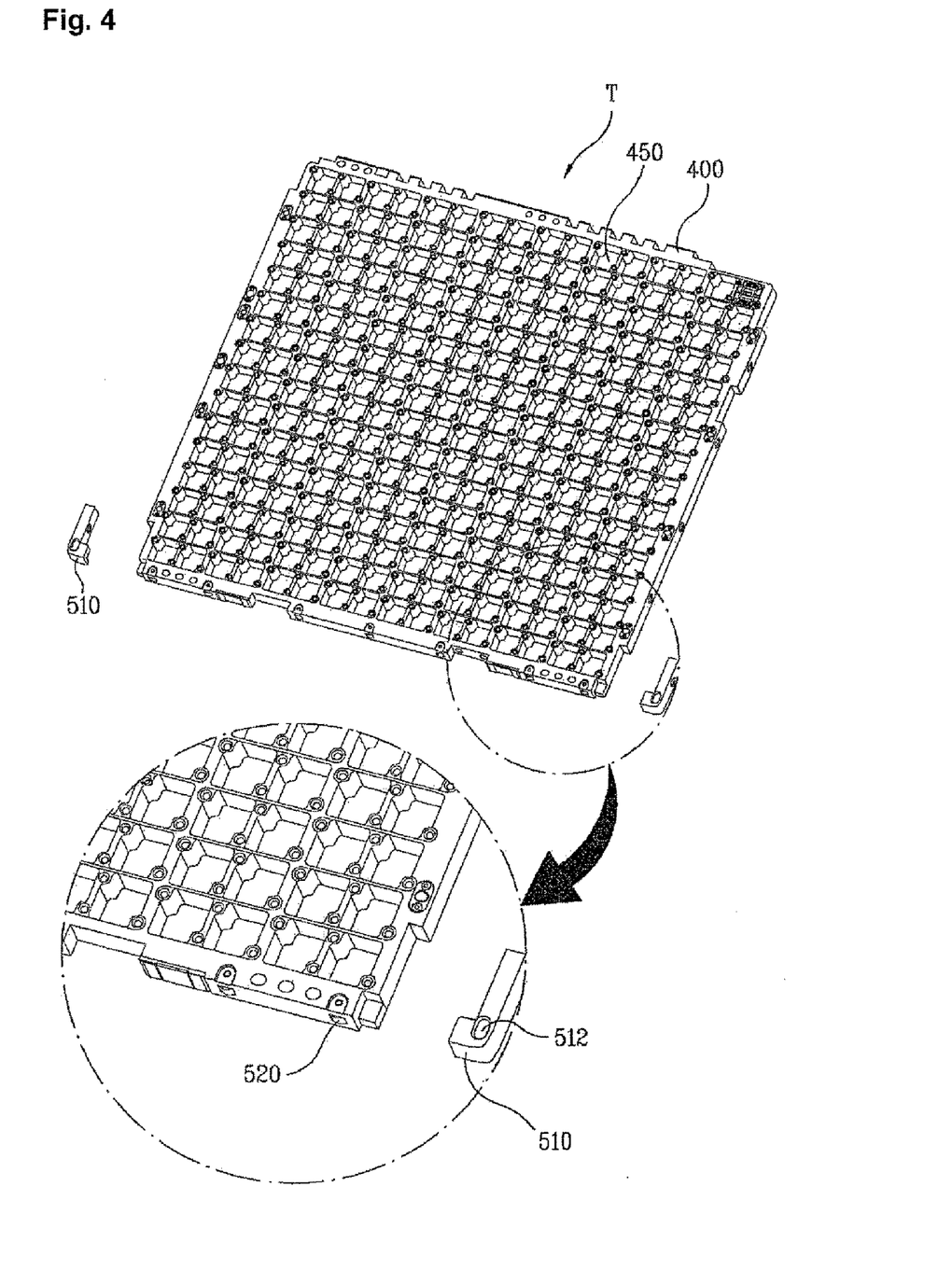
FIGS. 4 through 9 are perspective views of different embodiments of test trays.
Figure 5:
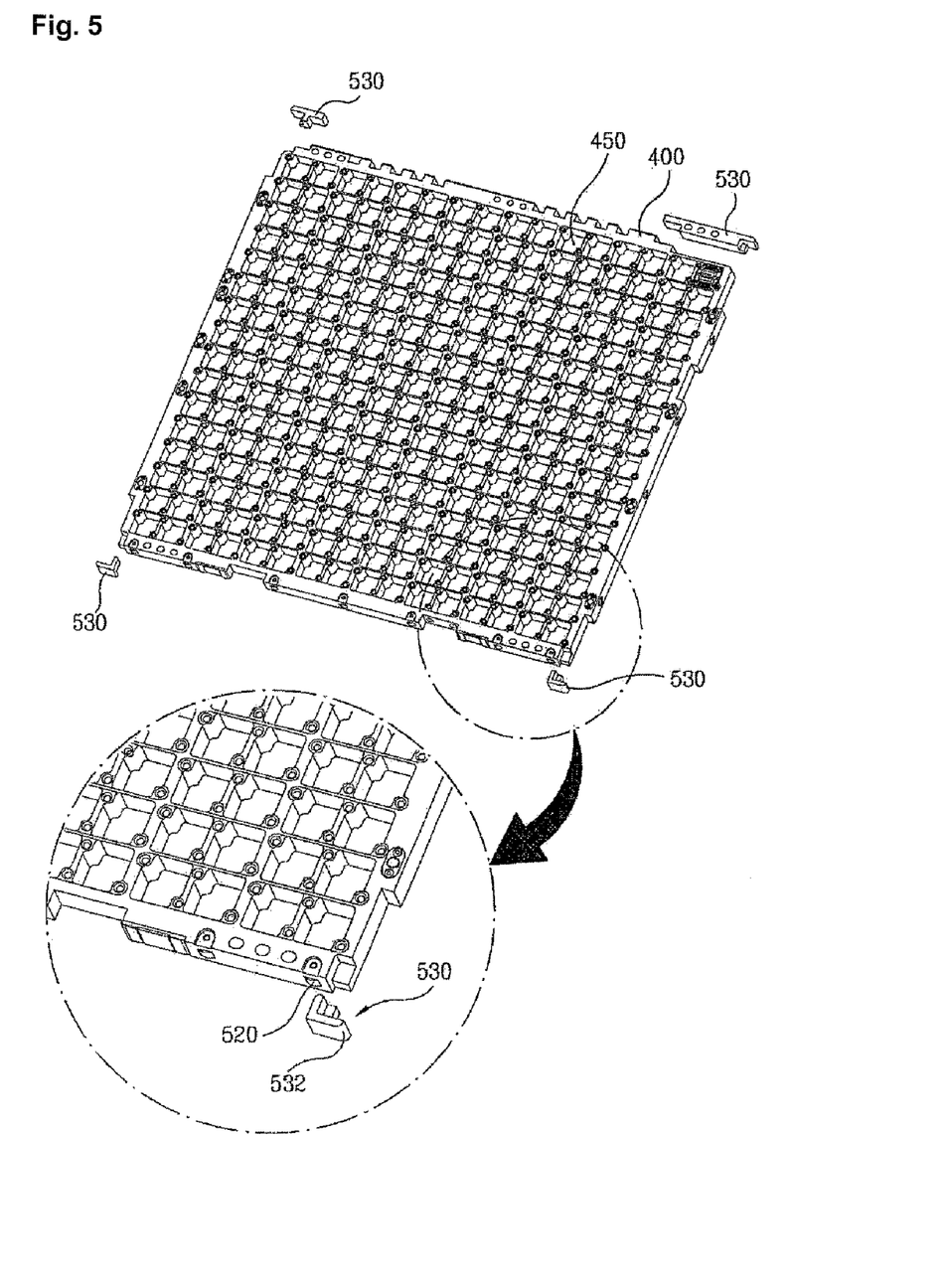

Referring to FIGS. 4 through 12, the connecting members and the moving apparatus are now described As shown in FIGS. 4 and 5, a test tray T according to a first embodiment includes a frame 400 with a lattice structure, and carriers 450 that are fixed to the frame 400 and into which packaged chips are loaded. One or more connecting members 510 and/or 530 are detachably mounted to lateral sides or corners of the frame 400. The connecting members may be a first type of connecting member 510 with a groove, which is provided on at least one corner of the frame 400, as shown in FIG. 4. The connecting members could also be second type of connecting member 530 with a projection 532 which could also be provided on at least one corner of the frame 400, as shown in FIG. 5.

Note, the basic frame of the test tray could be manufactured so that either of these two types of connecting members can be mounted to the frame. This means that even after the frames have been configured with a first type of connecting member, the frames could subsequently be re-configured with the other type of connecting member.

One or more wheels 520 may be provided on the lateral sides of the frame 400. When the test tray is moved along a rail, the wheels reduce friction between the test tray T and the rail.

The moving apparatus of a test handler would engage the first connecting member 510 shown in FIG. 4 or the second connecting member 530 shown in FIG. 5 to move the test tray along one or more of the paths described above. The moving apparatus is now described.

Figure 10:
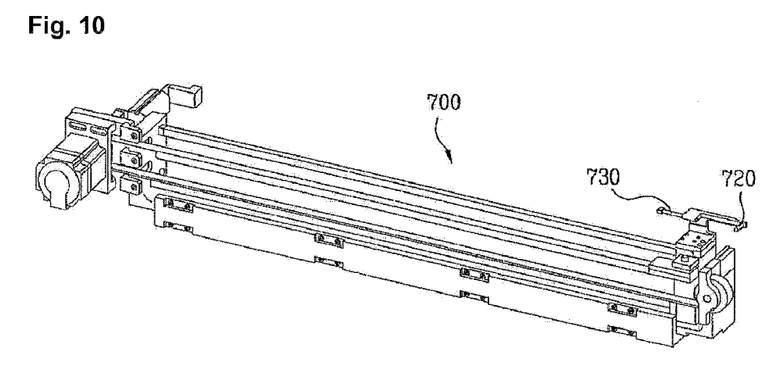
FIG. 10 is a perspective view of a first embodiment of a moving apparatus for a handler.

FIG. 10 shows a first moving apparatus 700 for a test handler. The first moving apparatus 700 is provided between the first chamber 20 and the second chamber 30 to move the test tray T along the second path, and between the second chamber 30 and the third chamber 40 to move the test tray T along the third path.

As shown in FIG. 10, the first moving apparatus 700 includes a first protruding part 720. The first protruding part 720 engages the groove 512 of the first connecting member 510 shown in FIG. 4 or the projection 532 of the second connecting member 530 shown in FIG. 5. Thus, a test tray T equipped with the first or second connecting member 510 or 530 can be moved along the second path from the first chamber 20 to the second chamber 30 or the third path from the second chamber 30 to the third chamber 40.

The first moving apparatus 700 may include a second protruding part 730 extending in the direction opposite to the direction in which the first protruding part 720 extends. When moved, the second protruding part 730 pushes a lateral side of the test tray T. thus moving the test tray T.

The first and second protruding parts 720 and 730 are moved by a driving unit (not shown) such as an air pressure cylinder provided to the first moving apparatus 700. The driving unit moves the first and second protruding parts 720 and 730 at the same time. In this manner, the first moving apparatus 700 having the first and second protruding parts 720 and 730 can move two test tray T at the same time. For instance, assume that a first test tray T is located inside the first chamber 20 and a second test tray T is located inside the second chamber 30. When the first and second protruding parts 720 and 730 are moved at the same time, the first test tray T, which is located inside the first chamber 20, is moved into the second chamber 30 by the first protruding part 720 and at the same time the second test tray T, which is located inside the second chamber 30, is moved into the third chamber 40 by the second protruding part 730.

In some test handlers, the first and second protruding parts 720 and 730 of the first moving apparatus 700 are horizontally moved, to move the test trays T horizontally between the first, second, and third chambers 20, 30, and 40 as shown in FIGS. 1 and 3. In other handlers, the first and second protruding parts 720 and 730 of the first moving apparatus 700 could also be vertically moved, to move the test trays T vertically between the first, second, and third chambers 20, 30, and 40 as shown in FIG. 2.

A connecting member and a moving apparatus are now described which are necessary for a test tray T to move forward along the first path inside the first chamber 20 or along the fourth path inside the second chamber 40.

Figure 6:
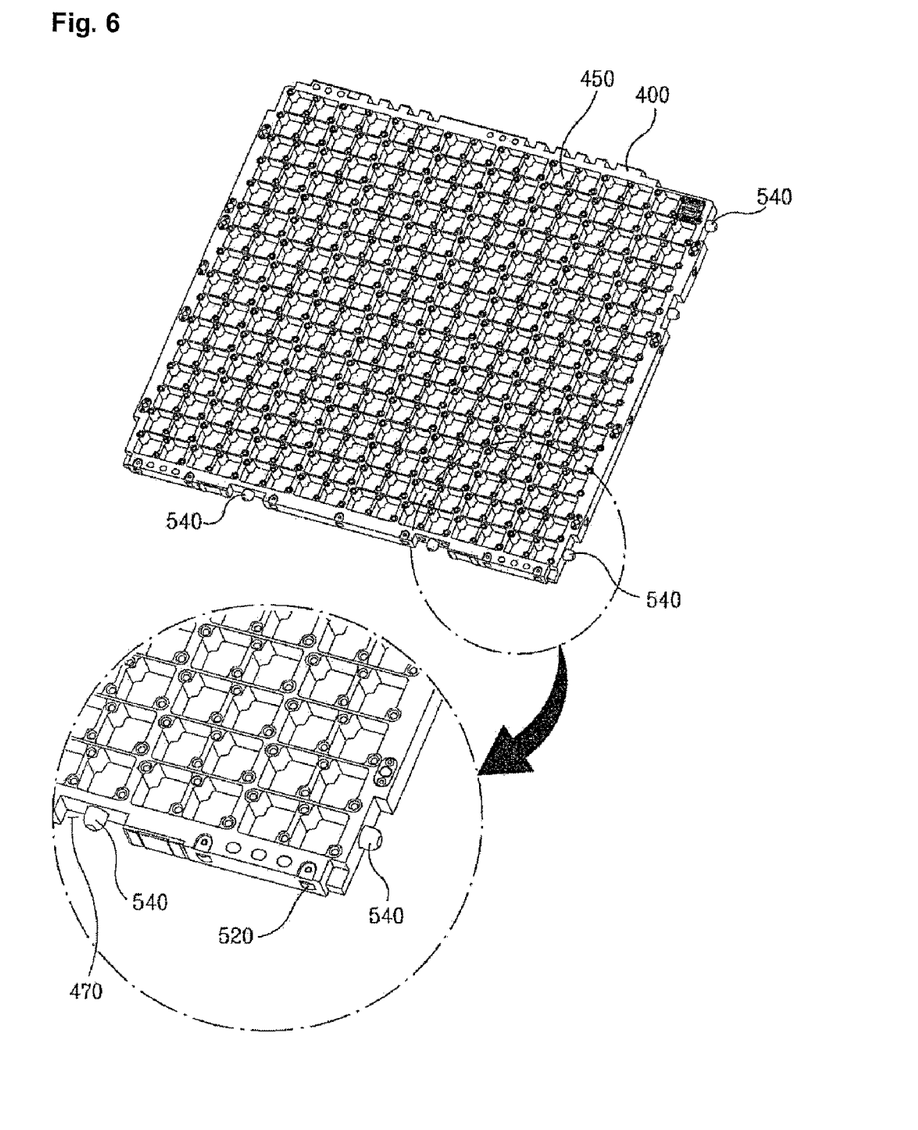
Figure 7:
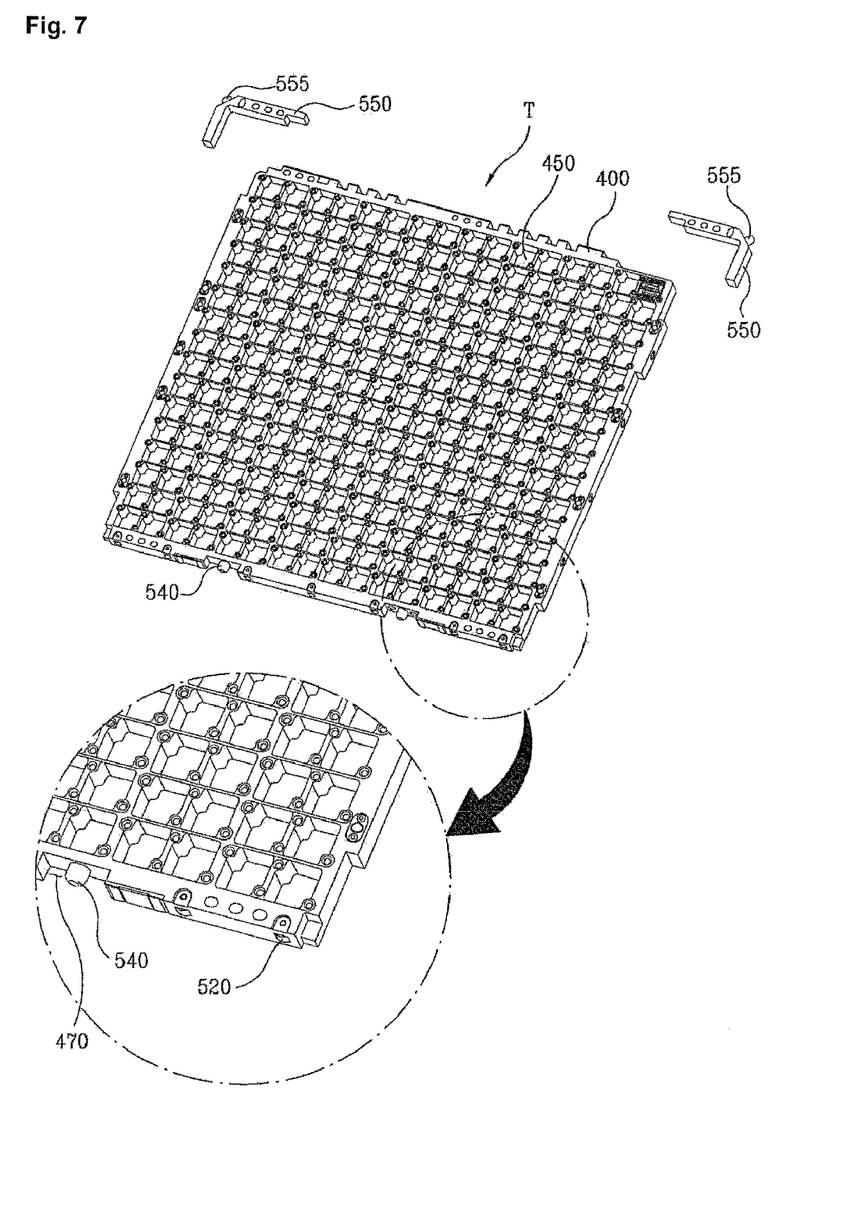

As shown in FIGS. 6 and 7, a test tray T according to another embodiment includes a frame 400 with a lattice structure, and carriers 450 fixed to the frame 400 and into which packaged chips are loaded. A first projection 540 is detachably mounted to at least one lateral side of the frame 400, and/or to a corner of the frame. At least one lateral side of the frame 400 may have a groove 470, and the first projection 540 may be provided in the groove 470. One lateral side may have two or more grooves 470. Accordingly, projections 540 may be provided in each of the grooves 470.

FIG. 6 is a view illustrating an embodiment where each of two lateral sides of the frame 400 has two grooves 470 each of which has the first projection 540.

FIG. 7 is a view illustrating an embodiment where one lateral side of the frame has two grooves 470, each of which has a projection 540. In this embodiment, a third connecting member 550 having a second projection 555 is provided on each of two corners of the frame 400.

A moving apparatus of a test handler may engages the first projection 540 of the test tray T shown in FIG. 6, or the first and second projections 540 and 555 of the test tray T shown in FIG. 7. Thus, the test tray T is made to move along the first or fourth path. A moving apparatus that interacts with the projections will now be described.

Figure 11:
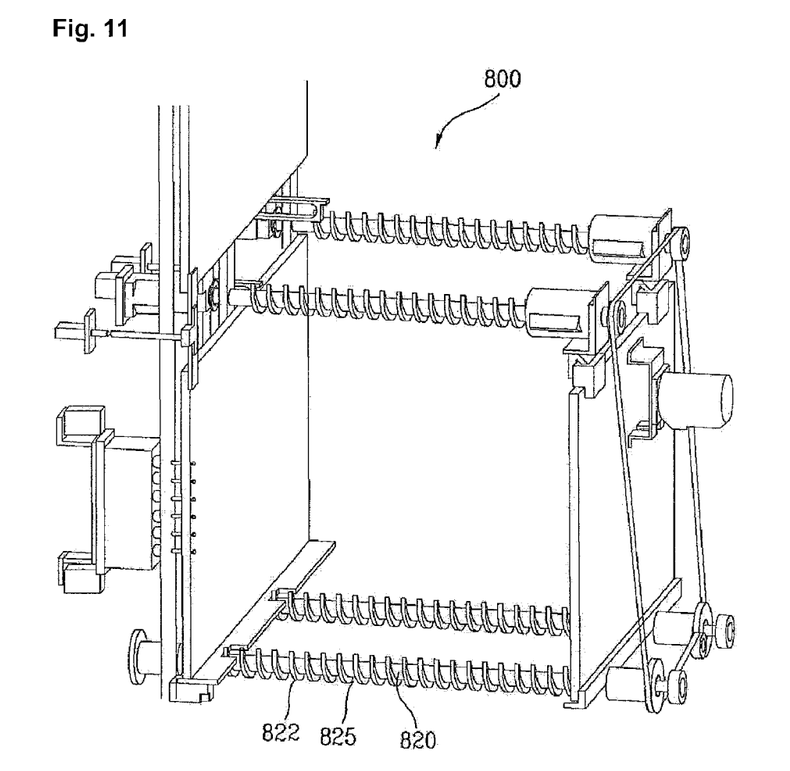
FIG. 11 is a perspective view of a second embodiment of a moving apparatus for a handler.

FIG. 11 is a view of a second type moving apparatus 800. The second moving apparatus 800 is provided inside the first chamber 20 to move the test trays T forward along the first path. The second moving apparatus is also provided inside the third chamber 40 to move the test trays T forward along the fourth path.

As shown in FIG. 11, the second moving apparatus 800 includes two or more shafts 820, each of which is squarely threaded to have a flat crest 822 and a flat root 825. The flat bottom of the shaft 820 engages the first or second projection 540 or 555. Thus, when the shafts 820 are rotated, the first or second projections 540 or 555 are moved along the flat root 825. Accordingly, the test tray T is moved forward inside the first or third chambers 20 or 40.

As shown in FIG. 11, the second moving apparatus has a pair of the shafts 820 on the bottom and a pair of the shafts 820 on the top. The flat root 825 of each of the two shafts 820 on the bottom engages the first projections 540 of the test tray T shown in FIG. 7. The flat root 825 of each of the two shafts 820 on the top engages the second projections 555 of the test tray T shown in FIG. 8.

In an alternate embodiment, the second moving apparatus 800 may have a pair of the shafts 820 on the bottom and a pair of the shafts 820 on the sides. In this case, the first projections 540 engage the flat root of each of the four shafts 820 on the bottom and on the sides. As the shafts rotate, the test tray T is made to move forward. Positions of the pair of the shafts may vary depending on where the first and second projections 540 and 555 are located on the lateral sides of the test tray T.

Figure 12:
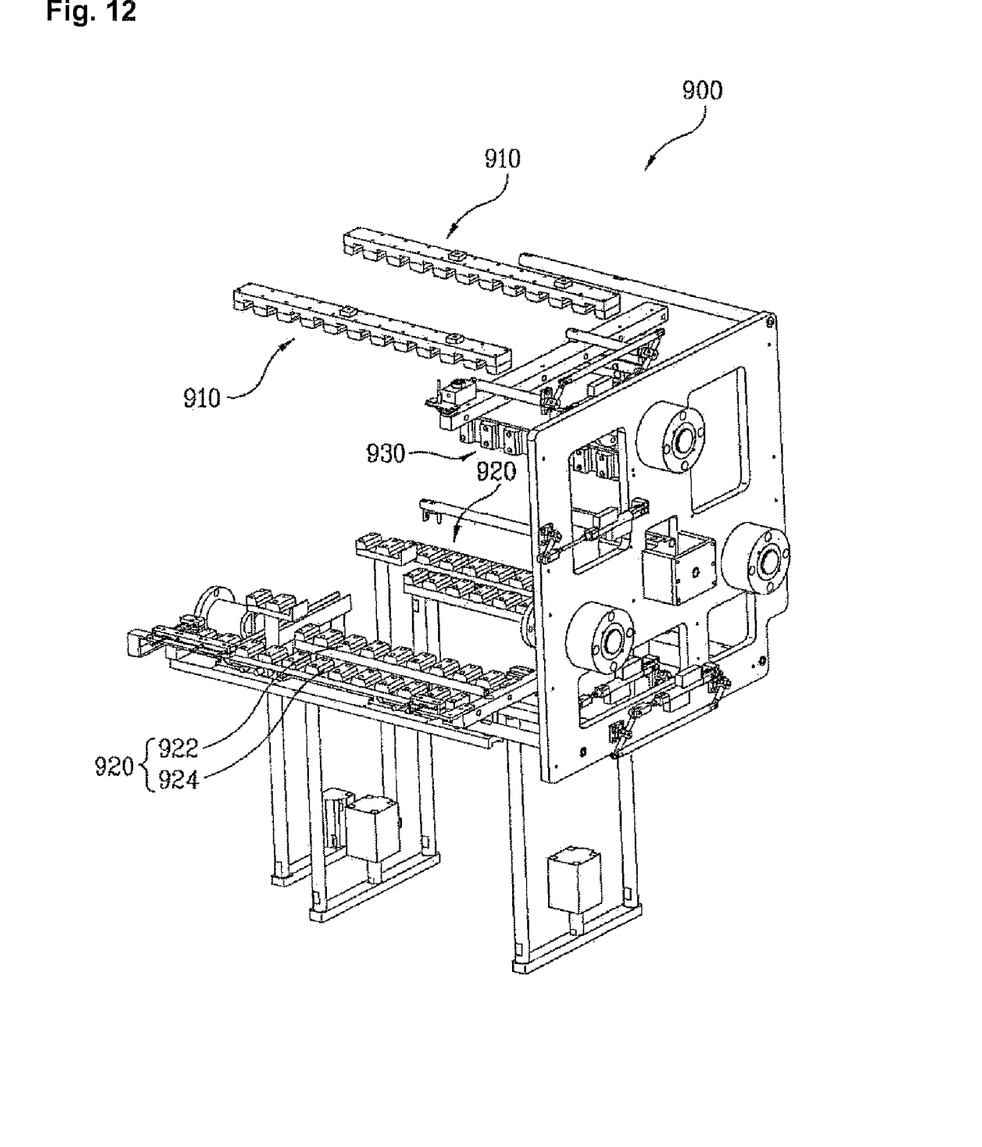
FIG. 12 is a perspective view of a third embodiment of a moving apparatus for a handler.

FIG. 12 is a perspective view of a third embodiment moving apparatus 900. The third moving apparatus 900, like the second moving apparatus 800, is provided inside the first or third chamber 20 or 40.

As shown in FIG. 12, the third moving apparatus 900 includes a first rod 910 holding an upper side of an upright-positioned test tray T and a second rod 920 holding a lower side of the upright-positioned test tray T. Each of the first and second rods 910 and 920 has grooves into which the test trays T are inserted.

The first rod 910 is held firmly in place inside the chamber. The second rod 920 is movable up and down, or to the left and the right inside the chamber to move the test tray T. The second rod 920 includes a first subordinate rod 922 movable up and down, and a second subordinate rod 924 movable to the left and the right. Operation of the third moving apparatus 900 with the first and second rods 910 and 920 is now described referring to FIGS. 13a through FIG. 13d.

Figure 13A:
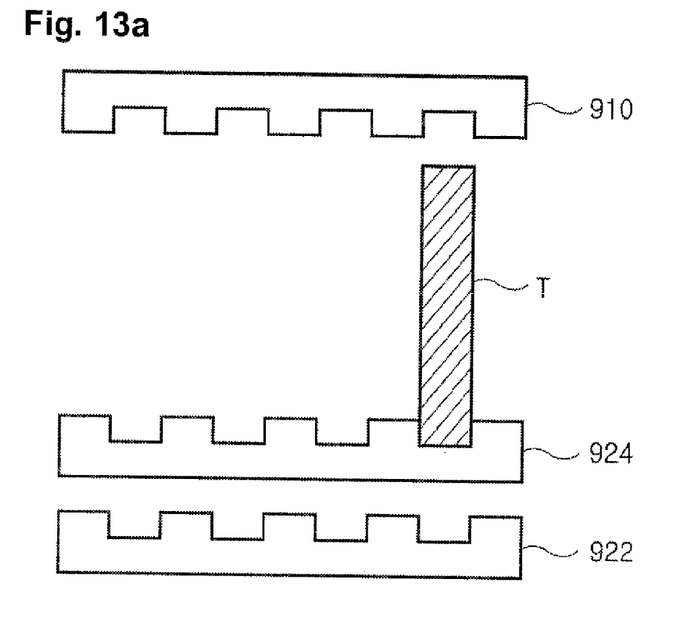
FIGS. 13a through 13d are cross-sectional views illustrating operations of the third moving apparatus shown in FIG. 12

As shown in FIG. 13A, the first rod 910 is located in a higher position, and the second rod 910 is located in a lower position, that is, below the first rod 910. The first subordinate rod 922 is located below the second subordinate rod 924, and the second subordinate rod 924 holds the test tray T.

Figure 13B:
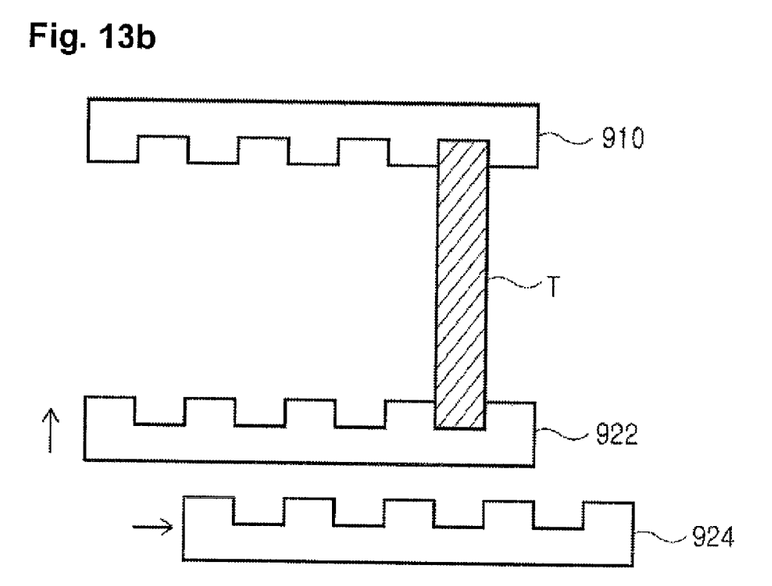

As shown in FIG. 13b, the first subordinate rod 922 is moved up to be located above the second subordinate rod 924, so that the first subordinate rod 922 and the first rod 910 cooperate to hold the test tray T. Thereafter, the second subordinate rod 924 is moved a step to the right.

Figure 13C:
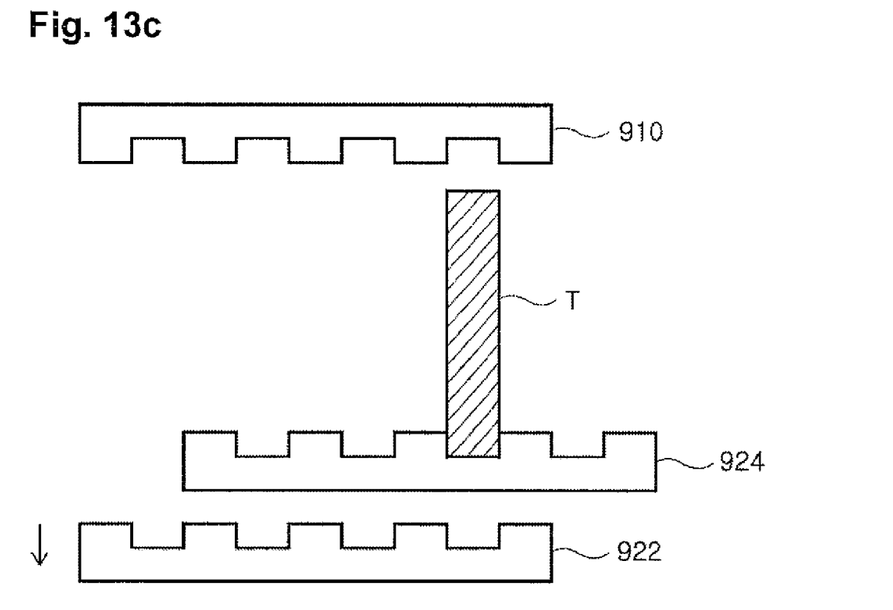
Figure 13D:
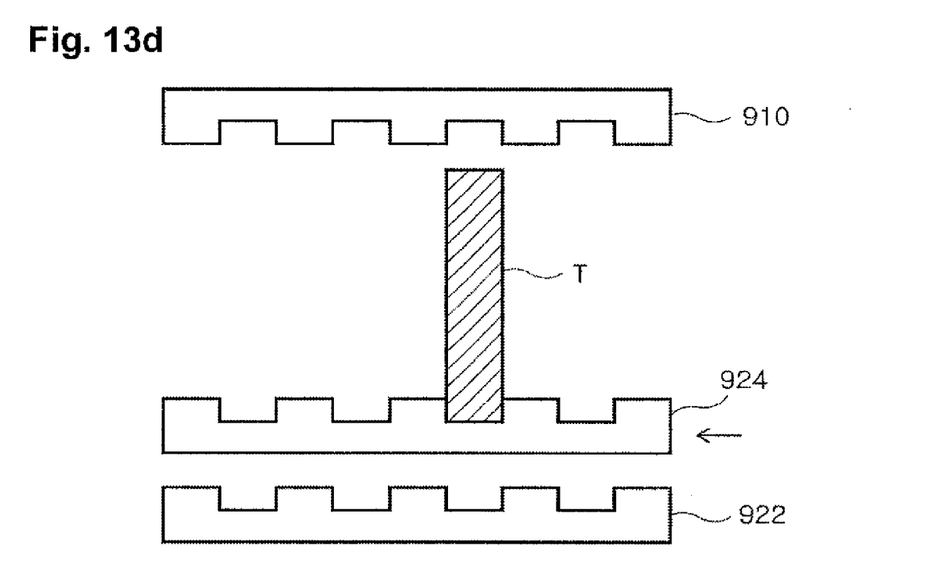

Subsequently, the first subordinate rod 922 is moved downward so that it ends up located below the second subordinate rod 924. As a result, the second subordinate rod 924 holds the test tray T, as shown in FIG. 13C. Subsequently, the second subordinate rod 924 is moved a step to the left, as shown in FIG. 13d. This results in the test tray moving one step to the left.

Repetitious motion of the first and second subordinate rods 922 and 924, as above described, enables the test tray T to be moved through the inside of the first and third chambers.

The third moving apparatus 900 may further include a third rod 930 holding a lateral side of the upright-positioned test tray T, to move the upright-positioned test tray T more stably. The third rod 930, like the second subordinate rod 922, is moved to the left and the right to move the test tray T.

The third moving apparatus 900 moves upright-positioned test trays T by repeatedly holding and releasing the upper and lower sides or the upright-positioned test trays, or the upper, lower, and lateral sides of the upright-positioned test trays. This moving apparatus does not require the use of the connecting members. That is, the third moving apparatus 900 does not necessarily require the first and second projections 540 and 550 to be mounted on the test trays.

In a handler equipped with both of the first moving apparatus 700 as shown in FIG. 10 and the second moving apparatus 800 as shown in FIG. 11, a test tray T is required to be equipped with a combination of connecting members as shown in FIGS. 4 or 5, and connecting members as shown in FIGS. 6 and 7. In a handler equipped with both the first moving apparatus 700 shown in FIG. 10 and the third moving apparatus 900 as shown in FIG. 12, the test tray T is allowed to be equipped with any one of the connecting members as shown in FIGS. 4 and 5.

Figure 8:
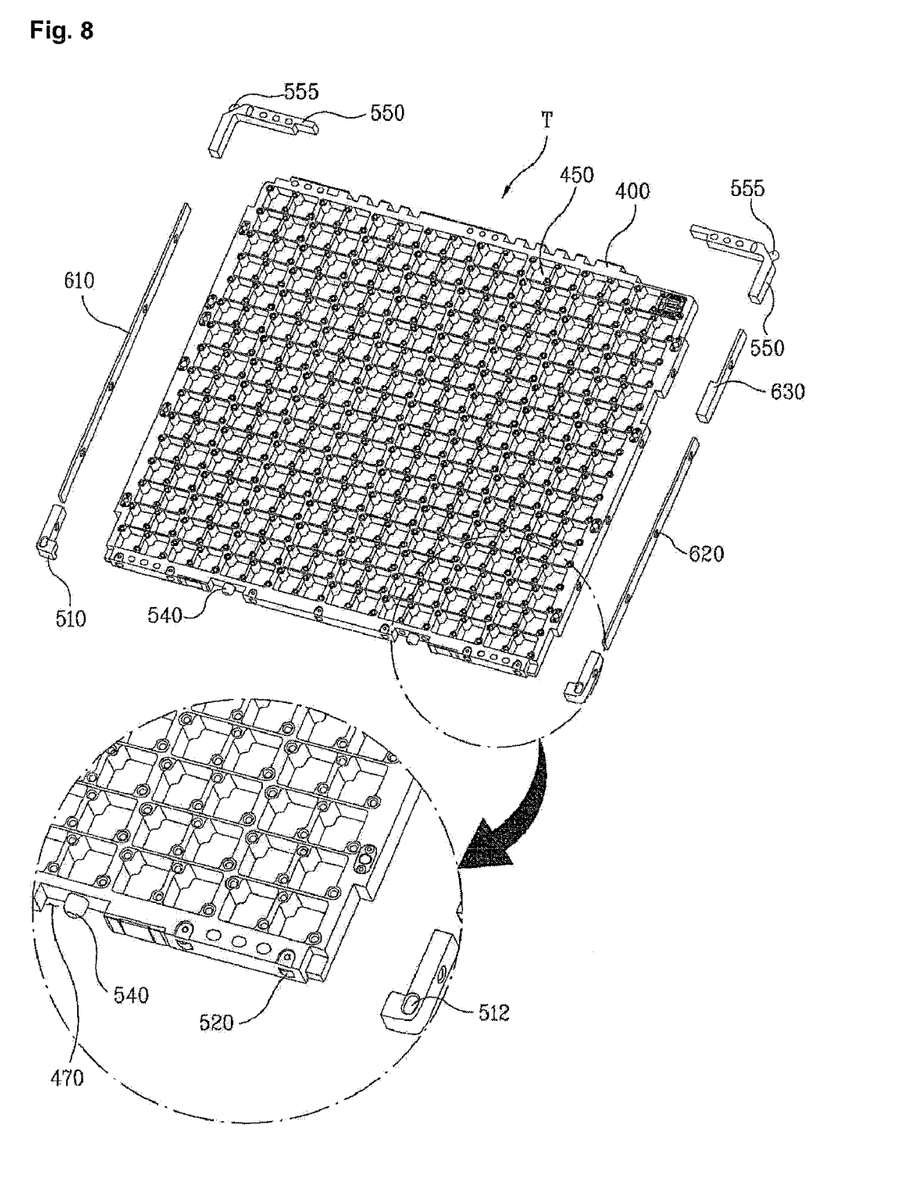
Figure 9:
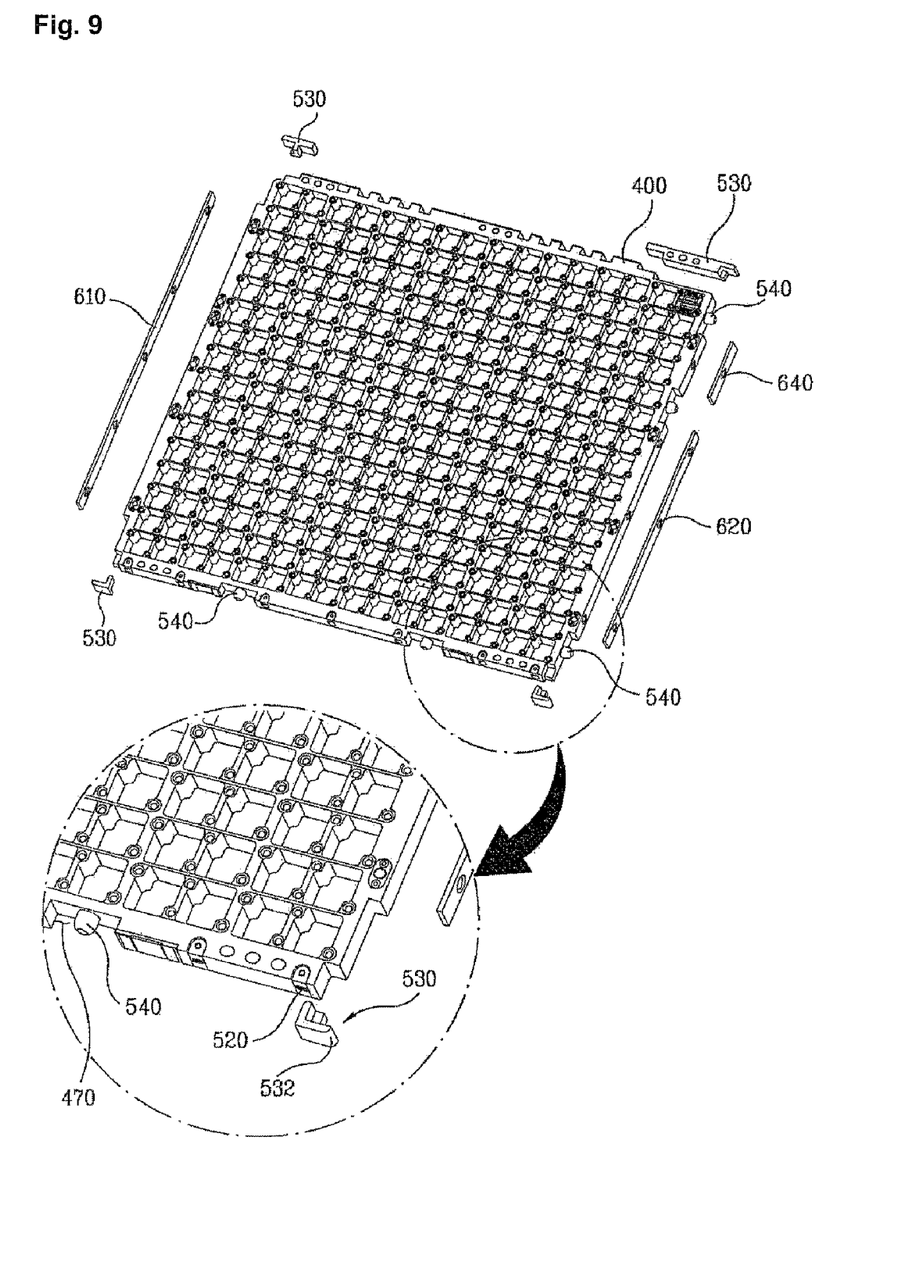

FIGS. 8 and 9 are views which illustrate test trays T equipped with a combination of the connecting members shown in FIGS. 4-7. The test tray, as shown in FIG. 8 includes a frame 400 with a lattice structure and carriers 450 fixed to the frame 400, into which packaged chips are loaded. First connecting members 510, each of which has a groove 512, are provided on two corners of the frame 400, At least one wheel 520 is provided on a lateral side of the frame 400. First projections 540 are provided in recessed grooves 470 on the lateral sides of the frame 400. Third connecting members 550, each of which has a second projection 555, are provided on each of two corners of the frame 400. First, second, and third bars 610, 620, 630 are detachably provided on the lateral sides of the frame 400.

A test tray as shown in FIG. 9 includes a frame 400 with a lattice structure, and carriers 450 fixed to the frame 400, into which the packaged chips are placed. Second connecting members 530, each of which has a projection 532, are provided on four corners of the frame 400. At least one wheel 520 is provided on a lateral side of the frame 400. First projections 540 are provided in each of two recessed grooves 470 on the lateral side of the frame 400. First, second, and fourth bars 610, 620, and 640 are detachably provided on the lateral sides of the frame 400.

Selective combination of the first, second and connecting members 510, 530, and 540 enables the test tray T to be compatible with a handler having any type of the moving apparatus. Thus, the test trays can be used interchangeably in handlers in which the first, second, and third chambers are arranged in a column or in a row relative to each other.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, variations and modifications are possible in the component parts and/or arrangements of the subject combinations which would fall within the scope of the disclosure, the drawings and the appended claims. In addition to variations and modifications in the component parts and/or arrangements, alternative uses will also be apparent to those skilled in the art.

What is claimed is:

1. A semiconductor test handler, comprising:
    a first chamber in which packaged chips mounted on a test tray are heated to high temperature or cooled to low temperature;
    a second chamber in which the packaged chips mounted on the test tray are tested;
    a third chamber in which the packaged chips mounted on the test tray are cooled or heated to room temperature;
    a moving mechanism which moves the test tray between the first, second and third chambers; and
    a plurality of test trays, wherein each test tray comprises:
        a frame;
        a plurality of carriers mounted on the frame, wherein packaged chips are detachably mounted in the carriers; and
        at least one connecting member detachably mounted on the frame, wherein the moving mechanism interacts with the at least one connecting member to move the test tray between the first, second and third chambers.

2. The semiconductor test handler of 1, wherein each at least one connecting member comprises a groove.

3. The semiconductor test handler of claim 2, wherein the moving mechanism comprises a first protruding part which is movable horizontally or vertically, and wherein the fast protruding part is inserted into the groove of the at least one connecting member.

4. The semiconductor test handler of claim 1, wherein the at least one connecting member comprises a projection.

5. The semiconductor test handler of claim 4, wherein the moving mechanism comprises a first protruding part which is movable horizontally or vertically, wherein the first protruding part engages the projection on the at least one connecting member.

6. The semiconductor test handler of claim 1, wherein the at least one connecting member comprises a projection, and wherein the at least one connecting member is detachably mounted on a lateral side of the frame.

7. The semiconductor test handler of claim 6, wherein the moving mechanism comprises at least one squarely-threaded shaft having a flat crest and a flat root, and wherein the flat root engages the projection of the at least one connecting member on the lateral side of the frame.

8. The semiconductor test handler of claim 1, wherein the moving mechanism comprises:
    a fixed first rod mounted in an upper portion of the first or third chamber, wherein a plurality of grooves on the first rod engage an upper portion of a test tray; and
    a second rod mounted in a lower portion of the first or third chambers, wherein the second rod comprises:
    a first subordinate rod that is movable up and down; and
    a second subordinate rod that is movable to the left and the right, wherein the first and second subordinate rods alternate in supporting a lower portion of the test tray.

9. The semiconductor test handler of claim 1, wherein the at least one connecting member comprises:
    a first connecting member with a projection that is detachably mounted on a lateral side of the frame; and
    a second connecting member with a projection that is detachably mounted on a corner of the frame.

10. The semiconductor test handler of claim 9, wherein the moving mechanism comprises a plurality of squarely-threaded shafts, each shaft having a flat crest and a flat root, and wherein the flat roots of the plurality of shafts engage the projections of the first and second connecting members.

11. The semiconductor test handler of claim 1, wherein the at least one connecting member comprises:
    a first connecting member having a groove that is detachably mounted on a corner of the frame;
    a second connecting member having a projection which is detachably mounted on a lateral side of the frame; and
    a third connecting member having a projection which is detachably mounted on a corner of the frame.

12. The semiconductor test handler of claim 1, wherein the at least one connecting member comprises:
    a plurality of corner connecting members, each of which has a projection, wherein the corner connecting members are detachably mounted on the four corners of the frame; and
    a plurality of lateral connecting members, each of which has a projection, wherein the lateral connecting members are detachably mounted on lateral sides of the frame.

13. A test tray for use in a semiconductor test handler, comprising:
    a frame;
    a plurality of carriers mounted on the frame and into which packaged chips are detachably mounted; and
    at least one connecting member that is detachably mounted on the frame, wherein the at least one connecting member interacts with a moving mechanism of a test handler such that the moving mechanism moves the test tray between different chambers of the test handler.

14. The test tray of claim 13, wherein the at least one connecting member comprises groove.

15. The test tray of claim 13, wherein the at least one connecting member comprises a projection.

16. The test tray of claim 13, wherein the at least one connecting member comprises a projection, and wherein the at least one connecting member is detachably mounted on a lateral side of the frame.

17. The test tray of claim 13, wherein the at least one connecting member comprises:
   at least one lateral connecting member having a projection, wherein each at least one lateral connecting member is detachably mounted on a lateral side of the frame; and
   at least one corner connecting member having a projection, wherein each at least one corner connecting member is detachably mounted on a corner of the frame.

18. The test tray of claim 13, wherein the at least one connecting member comprises:
   at least one lateral connecting member having a projection, wherein each at least one lateral connecting member is detachably mounted on a lateral side of the frame; and
   at least one recess connecting member having a recess, wherein each at least one recess connecting member is detachably mounted on a corner of the frame.

19. The test tray of claim 18, wherein the at least one connecting member further comprises at least one projection connecting member having a projection, wherein each at least one projection connecting member is mounted on a corner of the frame.

20. A test tray for use in a semiconductor test handler, comprising:
   a frame;
   a plurality of carriers mounted on the frame and into which packaged chips are detachably mounted;
   at least one projection formed on the frame; and
   at least one connecting member that is detachably mounted on the frame, wherein the at least one connecting member interacts with a moving mechanism of a test handler such that the moving mechanism moves the test tray between different chambers of the test handler.

21. The test tray of claim 20, wherein the at least one connecting member comprises a projection, and wherein the at least one connecting member is detachably mounted on a corner of the frame.

22. The test tray of claim 20, wherein the at least one connecting member comprises a recess, and wherein the at least one connecting member is detachably mounted on a corner of the frame.

* * * * *